(12) United States Patent
Bauer et al.

(10) Patent No.: US 7,915,975 B2
(45) Date of Patent: Mar. 29, 2011

(54) DMS FILTER WITH IMPROVED MATCHING

(75) Inventors: Thomas Bauer, Munich (DE); Andreas Waldherr, Munich (DE); Stefan Freisleben, Neubiberg (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/473,107

(22) Filed: May 27, 2009

(65) Prior Publication Data

US 2009/0289745 A1 Nov. 26, 2009

Related U.S. Application Data

(63) Continuation of application No. PCT/DE2007/002154, filed on Nov. 28, 2007.

(30) Foreign Application Priority Data

Dec. 5, 2006 (DE) .......................... 10 2006 057 340

(51) Int. Cl.
*H03H 9/64* (2006.01)
(52) U.S. Cl. ...................................... 333/193
(58) Field of Classification Search .................. 333/193, 333/195
See application file for complete search history.

(56) References Cited

U.S. PATENT DOCUMENTS

| | | | |
|---|---|---|---|
| 4,931,755 A | 6/1990 | Sakamoto et al. | |
| 5,558,711 A * | 9/1996 | Sakurai | 117/84 |
| 5,682,126 A | 10/1997 | Plesski et al. | |
| 6,879,086 B2 * | 4/2005 | Takamine | 310/313 D |
| 6,882,249 B2 * | 4/2005 | Takamine et al. | 333/193 |
| 6,936,952 B2 * | 8/2005 | Takamine | 310/313 D |
| 6,967,427 B2 * | 11/2005 | Yata | 310/313 D |
| 7,190,242 B2 * | 3/2007 | Takamine | 333/195 |
| 7,388,456 B2 * | 6/2008 | Furusato et al. | 333/193 |
| 7,623,009 B2 * | 11/2009 | Kando et al. | 333/193 |
| 2003/0035557 A1 | 2/2003 | Takamine et al. | |
| 2004/0080385 A1 | 4/2004 | Takamine et al. | |
| 2007/0296521 A1 | 12/2007 | Schmidhammer | |
| 2009/0009263 A1 | 1/2009 | Javid et al. | |

FOREIGN PATENT DOCUMENTS

| | | |
|---|---|---|
| DE | 695 33 389 T2 | 9/2005 |
| DE | 10 2004 031 397 A1 | 1/2006 |
| DE | 10 2005 010 658 A1 | 9/2006 |
| EP | 1 653 615 A1 | 5/2006 |
| JP | 01-321715 A | 12/1989 |
| JP | 06061783 A * | 3/1994 |

(Continued)

OTHER PUBLICATIONS

Morita, T., et al., "Wideband Low Loss Double Mode Saw Filters," 1992 Ultrasonics Symposium, pp. 95-104, IEEE.
EPCOS Data Sheet B9300, Low-Loss Dual Band Filter for Moibile Communication, SAW Components, May 19, 2005, pp. 1-9, EPCOS AG.

(Continued)

*Primary Examiner* — Robert Pascal
*Assistant Examiner* — Alan Wong
(74) *Attorney, Agent, or Firm* — Slater & Matsil, L.L.P.

(57) ABSTRACT

For improving the matching of a DMS track that is connected in series with a reactance element, it is proposed to connect a shunt branch to ground between the DMS track and reactance element parallel to the signal-carrying conductor section, where a capacitive element is arranged in this shunt branch.

30 Claims, 11 Drawing Sheets

FOREIGN PATENT DOCUMENTS

| | | | |
|---|---|---|---|
| JP | 08065089 A | * | 3/1996 |
| JP | 2002-064358 A | | 2/2002 |
| JP | 2002-111443 A | | 4/2002 |
| JP | 2002-111444 A | | 4/2002 |
| WO | WO 2005031971 A1 | * | 4/2005 |

OTHER PUBLICATIONS

EPCOS Data Sheet B9305, SAW Components, SAW Rx 2in 1 Filter, GSM1800/GSM1900, Oct. 16, 2006, pp. 1-12, EPCOS AG.

* cited by examiner

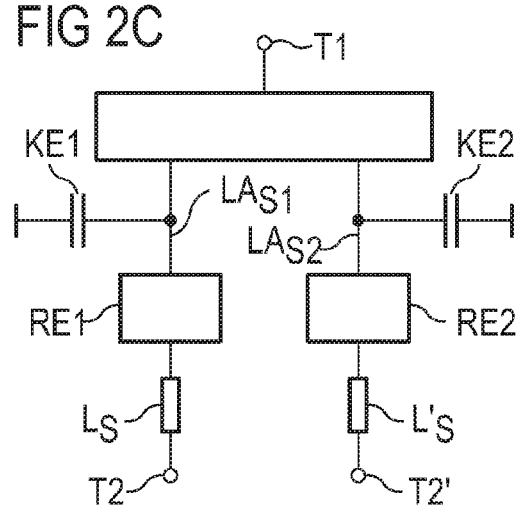
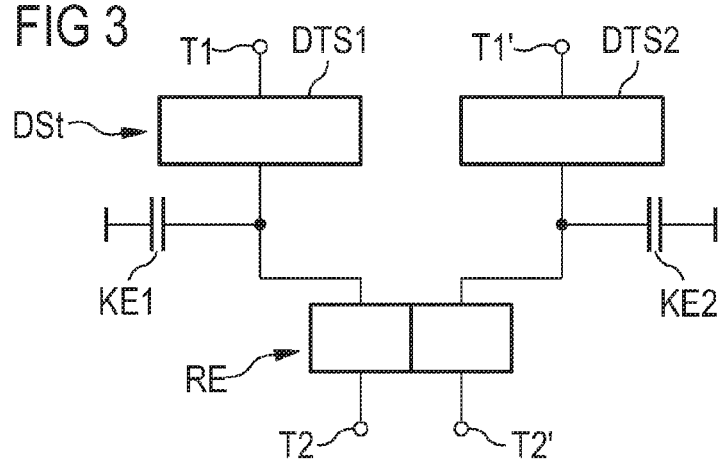
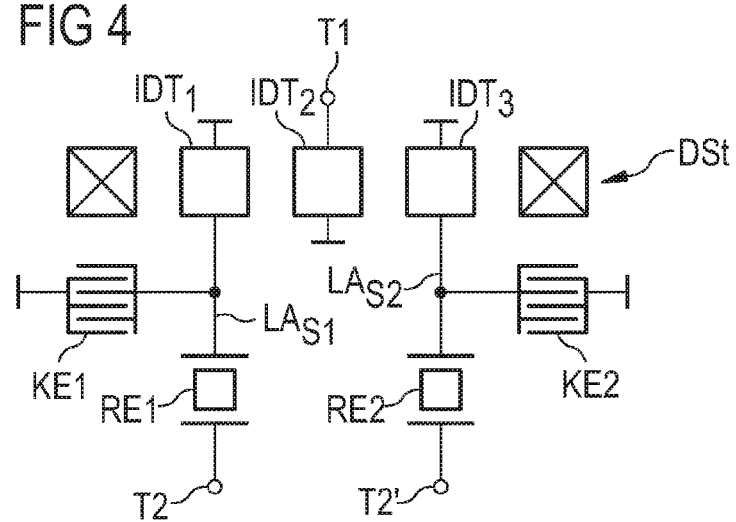

Normalized impedance: 150.0 Ω

Normalized impedance: 150.0 Ω

DMS FILTER WITH IMPROVED MATCHING

This application is a continuation of co-pending International Application No. PCT/DE2007/002154, filed Nov. 28, 2007, which designated the United States and was not published in English, and which claims priority to German Application No. 10 2006 057 340.4 filed Dec. 5, 2006, both of which applications are incorporated herein by reference.

TECHNICAL FIELD

The invention relates to a filter arrangement with a DMS track and a reactance element connected to this track.

BACKGROUND

Broadband DMS filters in known housings can be matched very well across the entire passband, so that only small changes in the input and output impedance are maintained. Together with the metallic connection areas provided on the chip, known housings form parasitic static capacitances that can reach considerable values. Therefore, external inductors are typically used in these housings in order to equalize the effects of the parasitic static capacitances.

Currently, housings with significantly smaller sizes and improved materials are being developed. Also, bare-die applications are undergoing development in which the bare chip is soldered onto a substrate. Wafer level packages that use, for example, a glass carrier with significantly lower permittivity than a standard ceramic carrier can also significantly lower the value of the static capacitances.

During the development process of such new designs, it has emerged that matching by means of the simple re-dimensioning of external inductors already in use is no longer possible for components made from the latest developments with reduced static capacitances. The margin of deviation that can be achieved in this way for the admittance on the input and output remains too large.

SUMMARY

The problem of the present invention is to disclose a filter arrangement that avoids these problems and that also allows good matching in an advanced package with greatly reduced static capacitances.

Embodiments of the invention disclose a filter arrangement in which a signal path connected between an input and an output is provided on a substrate. In the signal path, a DMS track and a reactance element are connected in series. Between the DMS track and the reactance element there is a shunt branch to the signal path in which there is an additional capacitive element that is connected to ground.

Contrary to expectations, it has emerged that in such a filter arrangement, the matching between the DMS track and the reactance element is improved and, in particular, the reflection is reduced. It has been shown that initially, the larger the value of the capacitance of the capacitive element that is set, the better the matching. However, because other problems are produced in the shunt branch with increasing capacitance, such as a reduction of the bandwidth, the exact dimensions of the capacitive element are defined and optimized as a function of defined initial conditions.

It is advantageous to form the reactance element as a SAW (surface acoustic wave) resonator. This has the advantage that the reactance element and the DMS track can both be produced on the same piezoelectric substrate using the same technology.

A capacitive element with a relatively high capacitance can be implemented as an interdigital structure. It could also be constructed as metallization on the piezoelectric substrate using the same technology as the DMS track and, optionally, the reactance element. The interdigital structure can have intermeshing comb electrodes that advantageously have a finger spacing that is less than the finger spacing of the interdigital structures used as the transducer of the DMS track. This has the advantage that the resonance frequency of the interdigital structure, which also acts as a resonator, will lie above a frequency range of interest for the filter arrangement, so that the transmission ratio of the filter arrangement is undisturbed.

The excitation of acoustic waves in the interdigital structure can also be minimized by selecting a suitable rotational angle with which the fingers are rotated relative to the transducers of the DMS structure. Suitable angles are, e.g., 90°. The feedback of power from a surface acoustic wave possibly generated by the interdigital structure into the DMS track or into a SAW resonator formed on the surface of the substrate can also be avoided if the interdigital structure of the capacitive element is rotated 90° relative to the interdigital structures of the transducer of the DMS track.

The capacitive element is advantageously also realized by correspondingly formed metallization layers on the surface of the substrate. In one embodiment, the capacitive element has two metallization layers that are arranged one above the other and that are electrically insulated from each other by an insulating layer. Here, the metallization layers can be spread over an area. However, it is also possible to adjust and, in particular, to increase the capacitance through the suitable selection of the material used for the insulating layer. In this way, it is possible to realize the capacitive element with sufficiently high capacitance as a simple crossing of a line connected to ground potential and a signal-guiding line of the signal path.

However, the decisive feature for the positive effect of the capacitive element is that it is connected at one position to the signal path that lies between the DMS track and the reactance element. The capacitive element can also be formed by two directly adjacent metallization areas that are formed on the substrate surface. Here, one of these metallization areas can be a ground terminal pad of the filter arrangement. The second metallization area is connected to one of the signal-guiding connection lines between the DMS track and the reactance element or is realized from a connection line that has been widened relative to a metallization area. A suitably high capacitance value of the capacitive element can then be set by selecting the size of the metallization areas sufficiently large and, in particular, by forming the metallization area connected to the signal path with a larger area or a larger width, respectively, or by reducing the spacing between the signal path and ground area.

Furthermore, it is possible to realize the capacitive element by a metallization area arranged on the substrate and a metallization layer arranged on the bottom side of the chip. Thus, the capacitance can be set sufficiently high, since the permittivity of the piezoelectric substrates is sufficiently high. A parasitic capacitance that is located between a signal-guiding line and a metallization layer arranged outside of the chip, for example, on the housing, is not considered a suitable solution because significant changes to the package are required and also the required capacitance values could probably not be achieved with air as the dielectric.

A DMS track that can be operated on the output side or in the direction of the reactance element has two sections of signal paths that are formed mutually symmetric and that can be connected according to an embodiment of the invention to ground via a capacitive element arranged in a shunt branch. If the filter arrangement has more than two signal paths between the DMS track and reactance element or reactance elements, then each of these signal paths is connected to ground in a corresponding way with a shunt branch and a capacitive element arranged in this shunt branch.

Each of the signal paths of the filter arrangement can have a reactance element formed as a single-port resonator. A filter arrangement with two signal paths that are mutually symmetric or sections of signal paths that have a symmetric configuration and that can be operated symmetrically can be connected to a respective port of a reactance element formed as a two-port resonator.

A higher number of signal paths can be connected to a corresponding number of multi-port resonators that act as reactance elements. The reactance elements formed as SAW resonators could be cascaded in two or more stages, wherein two resonators typically constructed with the same configuration are connected electrically one after the other in the signal path.

Advantageously, the DMS track has three to nine transducers. The transducer of the DMS track could be arranged between two reflectors. However, it is also possible to divide the DMS track into DMS sub-tracks and to arrange each sub-track between two reflectors. The sub-tracks could then each be connected to each other in parallel. Each sub-track is then also arranged in a signal (sub-) path. Symmetric operation is possible when there are two or more signal (sub-) paths. Both DMS tracks could be arranged directly adjacent on the substrate, wherein, with this configuration, the highest symmetry could be achieved for divided DMS tracks. However, it is also possible to arrange the acoustic tracks of two DMS tracks connected in parallel offset relative to each other for two signal paths of the filter arrangement.

The DMS track can have two advantageously centrally arranged transducers that are electrically connected in series. This could be achieved in a simple way such that, on one side of the DMS track, the current rails of the adjacent transducers are connected to each other and form a common current rail and, in contrast, on the other side, are separated. Two transducers connected in this way are also designated as V-split transducers. A V-split transducer is suitable, in particular, for DMS tracks that can be operated symmetrically at least on one side, since two signals that can be mutually symmetric can be tapped on the two divided current rails. Each of the two connections of a V-split transducer could also be connected in parallel to one or more transducers of the DMS track.

If two or more transducers of a DMS track are connected in parallel and their bus bars are here unified to form a common signal-guiding conductor section, then advantageously only one shunt branch together with the capacitive element is connected to this common conductor section.

In the DMS track of the filter arrangement, the number of ground lines can be advantageously reduced if the current rails lying at ground potential of adjacent transducers are connected to each other by means of terminal, extended fingers each pointing toward the adjacent transducer. Such a connection can have one or more electrode fingers depending on whether the terminal electrode finger is at ground potential or carries a signal. In this way, the ground terminal of such transducers is not able to reach the substrate surface without crossing track conductors.

In the filter arrangement, advantageously cascaded filter tracks are eliminated, since they feature higher losses than individual DMS tracks or tracks connected in parallel. For improving the selection properties, a sufficiently large number of basic elements of the reactance filter can in turn be selected.

The reactance element connected in series with the DMS track in the signal path is used to give the filter arrangement a steep edge, to increase the selection and 1 dB bandwidth, and to improve matching.

In addition to the shunt branches arranged between the DMS track and reactance element, the filter arrangement could have additional shunt branches that are provided on the input side and output side and that are connected to ground. In these shunt branches, additional reactance elements can be arranged. Advantageously, these reactance elements are formed as SAW resonators that could also be cascaded.

The additional capacitive element is used to match the DMS track to the reactance element. Without a matching element, the matching is not optimal, especially in the upper region of the passband. With the capacitive element in the shunt branch, good matching is achieved when its capacitance has a value of about 0.1-1.0 pF. While the typical average static capacitance of a transducer of the DMS track lies at, for example, 0.5-1.0 pF, the capacitance of the capacitive element corresponds to 0.1-2.0 times the value of the average static capacitance of a transducer in the DMS track. A suitable capacitance value for the capacitive element lies at 0.1-1.0 times or better for the 0.1-0.7 times value of the average static capacitance of a transducer in the DMS track. Higher capacitances of the capacitive element no longer lead to better matching, but instead cause problems, e.g., through reduction of the bandwidth. In particular, then other inductive external matching elements could be required. With increasing capacitance of the capacitive element, e.g., the inductance of existing external serial matching elements must be increased or the inductance of parallel matching elements must be reduced.

The matching is realized so that the DMS track and reactance element are matched to each other with respect to both power and also reflection. Power matching is achieved when the impedance of the DMS track is in a complex conjugate relationship to the impedance of the reactance element.

Another possibility for matching the DMS track to the reactance element consists in forming the capacitive element as a SAW resonator. In this way, the matching could be realized by means of the static capacitance of the resonator and the transmission properties of the filter arrangement could also be improved by means of its admittance, in that, for example, the resonance frequency of the SAW resonator is set to a value that is arranged in the region of the left flank of the passband. In this way it is possible to shape the passband with steeper flanks and to increase the selection. A SAW resonator as a capacitive element is advantageous especially for those filter arrangements whose transmission frequency lies in the 2-GHz range, that is, at least 1.6 GHz. Such a parallel resonator produces, in the upper passband, the required matching, in that it is essentially active there as a capacitance. In the lower region of the passband it is partially inductive. Therefore, in many cases the matching can also be effected merely by this SAW resonator without additional internal or external matching elements.

It is also favorable to move the resonance frequency of the capacitive element toward frequencies above the passband by selecting a smaller finger period than in the DMS filter. The SAW resonator then functions in the passband essentially like a static capacitance without exciting acoustic waves with the associated losses. At its resonance frequency, it acts approximately like a short circuit and blocks a stopband as defined by its bandwidth.

Although the parallel resonator used as the capacitive element together with the series reactance element appears to form the basic element of a ladder-type filter arrangement from the topology, the proposed filter arrangement nevertheless does not represent the series connection of a DMS track to a ladder-type basic element known from the literature, since the combination used here of the series reactance element and the parallel resonator with a resonance frequency above the passband of the filter arrangement considered by itself exhibits strong error matching or even absolutely no bandpass characteristics when the resonance of the parallel resonator lies above that of the series element. The basic element is thus not primarily used for improving the selection properties of the filter arrangement, but instead is used essentially for matching the DMS track to the series reactance element across the entire passband. In the ideal case, such a filter arrangement can eliminate additional external inductors as matching elements, because it is already optimally matched by means of the elements arranged on the substrate.

BRIEF DESCRIPTION OF THE DRAWINGS

The invention will be explained below in greater detail with reference to embodiments and the associated figures. In this way, the figures are shown purely schematically and not true to scale, so that neither absolute nor relative dimensional information is to be inferred from them.

FIGS. 2a, 2b and 2c, collectively FIG. 2, show an embodiment with two signal paths that are mutually symmetric;

FIG. 3 shows an embodiment with a DMS track divided in two;

FIG. 4 shows an embodiment example with interdigital structures as a capacitive element;

DETAILED DESCRIPTION

Figure 1:
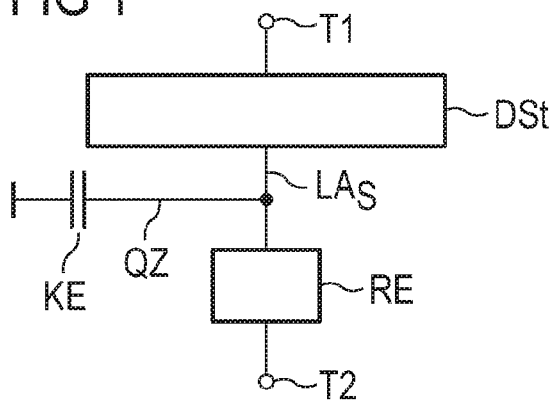
FIG. 1 shows a first simple embodiment example of a filter arrangement with a signal path.

FIG. 1 shows a first simple embodiment of the invention in which a signal path runs between a first terminal T1 and a second terminal T2, wherein a DMS track DSt is connected in series in the signal path with a reactance element RE by means of a signal-carrying conductor section $LA_s$. From the signal-carrying conductor section $LA_s$, a shunt branch QZ branches in which a capacitive element KE is arranged. The shunt branch is connected to ground. The ground terminals of the DMS track DSt are not shown for the sake of clarity, nor their individual transducers and reflectors and the exact construction of the reactance element RE. This filter arrangement can be operated asymmetrically on both sides, therefore "single-endedly" on both sides.

Figure 2A:
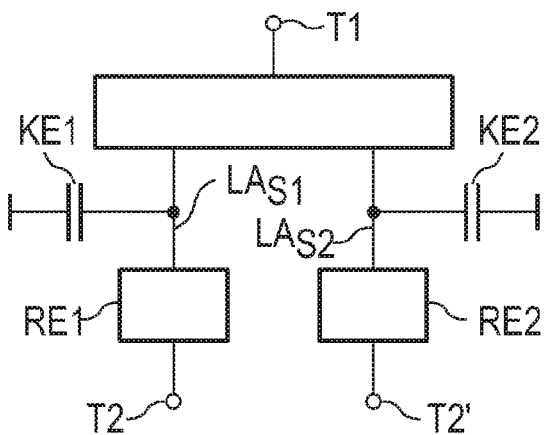
Figure 2B:
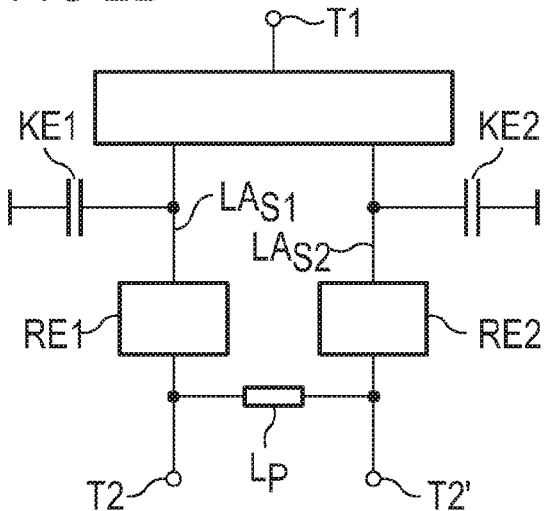

FIG. 2a shows a simple embodiment for a filter arrangement that can be operated single-endedly on a first terminal T1 and symmetrically on second terminals T2, T2'. Accordingly, the DMS track DSt is connected on the output side by means of two conductor sections $LA_{s1}$, $LA_{s2}$ that can be operated symmetrically to two reactance elements RE1, RE2. From each of the two symmetrically operated conductor sections $LA_s$, a shunt branch goes to ground in which a capacitive element KE1, KE2 is arranged. Here, the DMS track DSt and reactance elements RE could also be constructed arbitrarily. FIG. 2b shows the arrangement with an external parallel inductor $L_P$ as a matching element that is arranged in a shunt branch to the two terminals T2 and T2' on the output side. FIG. 2c shows the arrangement with two external series inductors $L_s$ and $L'_s$ as matching elements that are connected in series with the two terminals T2 and T2' on the output side.

FIG. 3 shows a simple embodiment in which the DMS track is divided into first and second DMS sub-tracks DTS1, DTS2 that are each limited by reflectors. The two symmetric conductor sections here open into a common four-pole reactance element RE that is suitable for guaranteeing symmetric signal guidance. From each of the two conductor sections connecting the DMS sub-tracks DTS and the reactance element RE, a shunt branch with a capacitive element KE arranged in this branch goes to ground. The arrangement can be operated symmetrically on the output side with respect to T2/T2'. On the input side, both a symmetric operation with respect to T1/T1' and also, after connecting T1 and T1', an asymmetric operation are possible when the transducers of the DMS track are suitably selected.

FIG. 4 shows another embodiment of the invention in which the DMS track is shown here with three transducers $IDT_1$, $IDT_2$, $IDT_3$. The two outer transducers $IDT_1$, $IDT_3$ are each connected by means of a conductor section $LA_{s1}$ and $LA_{s2}$ to a reactance element RE1, RE2 formed as a resonator. A shunt branch with a capacitive element KE1, KE2 arranged in this branch branches from the conductor sections $LA_{s1}$, $LA_{s2}$. The capacitive elements KE1, KE2 are here formed as an interdigital structure. In the embodiment shown, the interdigital structure is also rotated 90° towards the interdigital transducer of the DMS track DSt. Additionally or alternatively, the capacitive element KE1, KE2 formed as an interdigital structure could also have a finger spacing that is less than the finger spacing of the interdigital transducer of the DMS track DSt. This filter arrangement allows a single-ended/balanced operation, that is, an asymmetric/symmetric operation.

Figure 5:
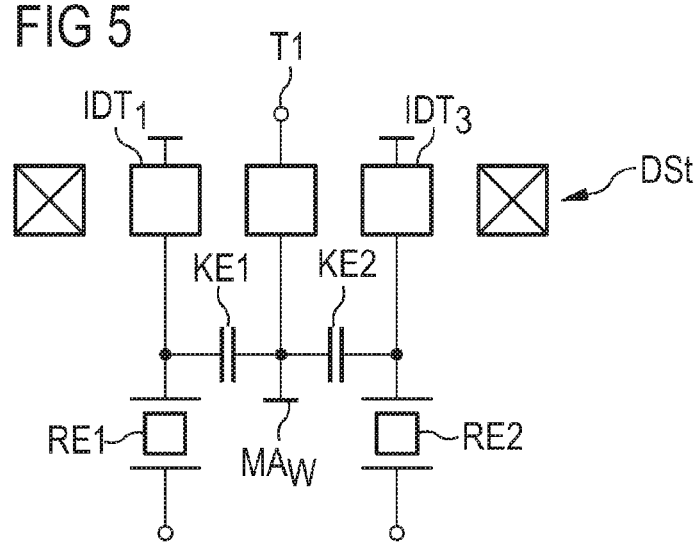
FIG. 5 shows an embodiment, in which the shunt branch is connected between the signal path and the ground terminal of a transducer of the DMS track.

In FIG. 5, another possibility is shown in general form in which the shunt branch is connected to the capacitive element KE arranged in this branch between a signal-carrying conductor section $LA_s$ and the ground terminal $MA_W$ of a transducer of the DMS track DSt. The two conductor sections $LA_s$ that are mutually symmetric are here connected to separate reactance elements RE1, RE2 formed as resonators. In one variant it is also possible to connect the two signal-guiding conductor sections $LA_s$ to a shunt branch in which one or two capacitive elements are arranged, without this shunt branch also still being connected to ground. Due to the symmetry, the middle of such a shunt branch lies at a virtual ground.

In FIG. 5, the capacitive element KE in each case could be constructed as an interdigital structure. In another implementation according to FIG. 6, the capacitive element KE is constructed in the form of two directly adjacent metallization areas that are arranged on the substrate. A first capacitive element KE1 is formed between a first signal-carrying metallization area $MF_{s1}$ and the ground terminal formed likewise to a metallization area $MF_M$ for a transducer of the DMS track DSt. While the ground terminal MA of the central transducer of the DMS track is already formed in known components typically as a wider terminal area for the formation of an electrical connection to a bond wire or a bump, in the embodiment according to FIG. 6, however, the signal-carrying conductor sections are guided differently and, in particular, closer to the ground terminal and also widened and/or extended compared with conventional conductor sections. A second capacitive element KE2 is formed between the ground terminal MA or its metallization area $MF_M$ and the signal-carrying conductor section widened into a second metallization area $MF_{s2}$.

Figure 7:
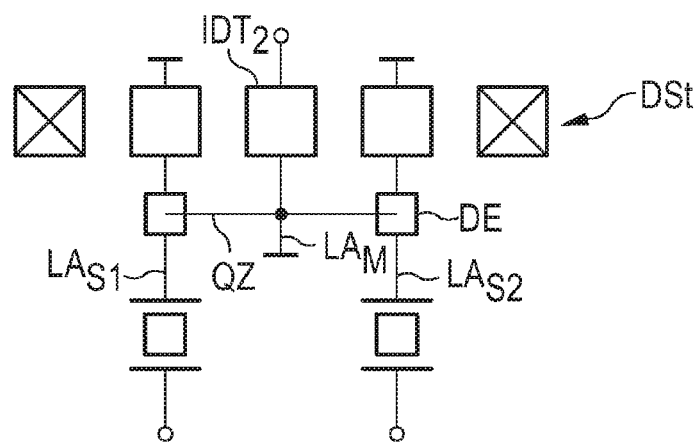
FIG. 7 shows an embodiment in which the capacitive element is constructed in the form of a track conductor crossing.

FIG. 7 shows an embodiment of the filter arrangement in which the capacitive element arranged in the shunt branch to the conductor section is constructed in the form of two conductor crossings of the shunt branches with one conductor section of the ground terminal of an interdigital transducer of the DMS track lying at ground. Connections to the conductor sections $LA_{s1}$ and $LA_{s2}$ go to the left and right from a grounded conductor section $LA_M$ that is connected to the ground terminal MA of the, here, central interdigital transducer of the DMS track DST. Between the conductor section $LA_M$ lying at ground and the conductor sections $LA_{s1}$ and $LA_{s2}$, there is a dielectric DE for preventing a short circuit, for example, an inorganic oxide layer or an organic resist layer. Advantageously, the dielectric is formed with a higher permittivity in order to adjust the capacitance of the capacitive element formed by the conductor crossing with sufficient height. In addition, it is possible to widen the crossing conductor sections at least in the region of the conductor crossing, in order to increase the overlap of the two conductor sections and thus the capacitance of the capacitive element.

Figure 8:
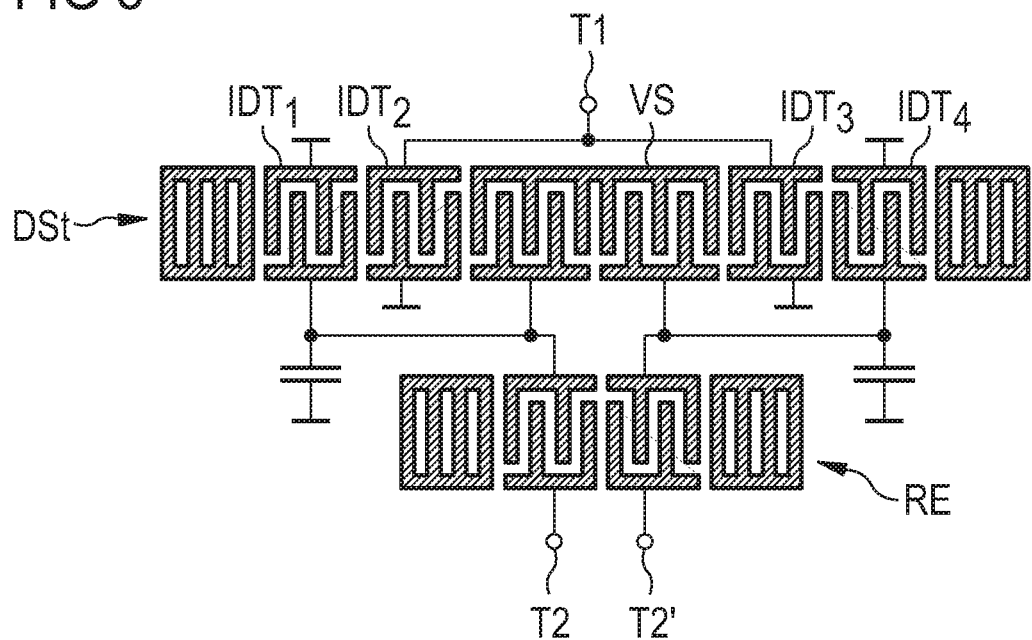
FIG. 8 shows a filter arrangement with a V-split transducer in the DMS track and a two-port resonator as a reactance element.

FIG. 8 shows an embodiment in which the DMS track has a V-split transducer VS as a central interdigital transducer that corresponds, strictly speaking, to a series connection of two interdigital transducers. The series connection is performed by the extended common current rail at the top in the figure. The V-split transducer could be connected to its upper current rail to ground. In contrast, in the two separate bottom current rails of the V-split transducer VS, a symmetric signal or two potentials that are mutually symmetric could be tapped.

On each of the two sides of the central V-split transducer VS there are two interdigital transducers $IDT_1$, $IDT_2$ and $IDT_3$, $IDT_4$, respectively. On both ends, the DMS track DSt is bounded by a reflector structure. On the input side, that is, connected to the first terminal T1 according to the definition, the two interdigital transducers $IDT_2$ and $IDT_3$ are connected in parallel. On the output side, for a first signal path the first interdigital transducer $IDT_1$ and the first output of the V-split transducer VS are connected in parallel and combined into one signal-carrying conductor section.

In a corresponding way, the second output-side terminal of the V-split transducer VS is connected in parallel to the fourth interdigital transducer $IDT_4$ and combined into a second signal-carrying conductor section. From the two symmetric signal-carrying conductor sections, a shunt branch to the capacitive element KE arranged in this branch is connected to ground. The output-side end of the conductor sections opens into a four-pole reactance element that are connected on the output side to the two second terminals T2, T2' that can be operated symmetrically to each other. Here, the four-pole reactance element RE is formed as a two-port SAW resonator.

As for SAW filter arrangements, usually it is also possible here, and also in all of the other embodiment examples, to operate the filter arrangement in the reverse direction, so that the terminals T2, T2' are connected to the input and the terminal T1 is connected to the output. Such a filter arrangement can thus have a balanced/single-ended operation.

Figure 6:
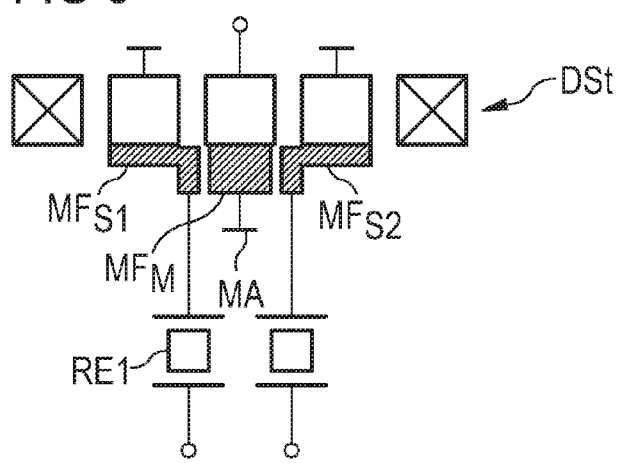
FIG. 6 shows a special embodiment of this example with conductor sections or terminal areas extended toward ground areas.
Figure 9:
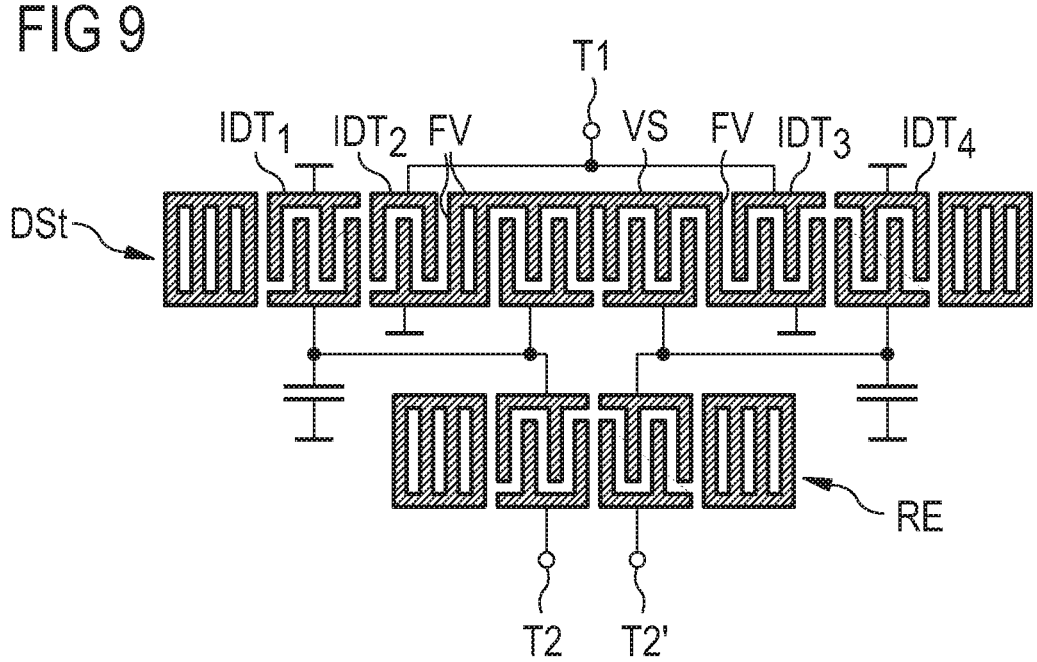
FIG. 9 shows an embodiment in which, in another configuration, terminal fingers are extended in order to connect opposing current rails connected to ground.

FIG. 9 shows another embodiment of a filter arrangement in which, compared with the embodiment according to FIG. 8, the central V-split transducer VS is also formed with extended terminal electrode fingers FV that connect the common current rail of the V-split transducer VS to the two opposing current rails of the adjacent interdigital transducers $IDT_2$ and $IDT_3$. In this way, without an additional ground terminal, the common current rail of the V-split transducer VS could be set to ground potential, which increases the symmetry of the arrangement, so that the deviation from the ideal phase difference of 180° is minimized on the two symmetric outputs. The capacitive elements could be constructed as a discrete capacitive element, particularly as an interdigital structure or as shown in FIG. 6 as conductor sections and terminal areas widened into capacitor plates.

Figure 18:
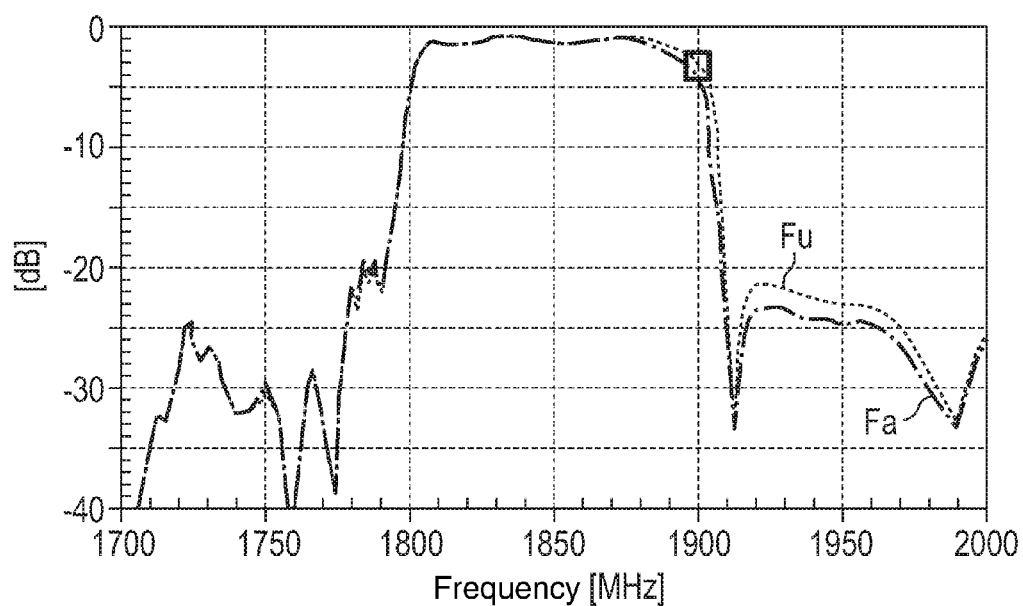
FIG. 18 shows the parameter $S_{21}$ of the filter arrangement of FIG. 9 with and without the capacitive element.
Figure 19:
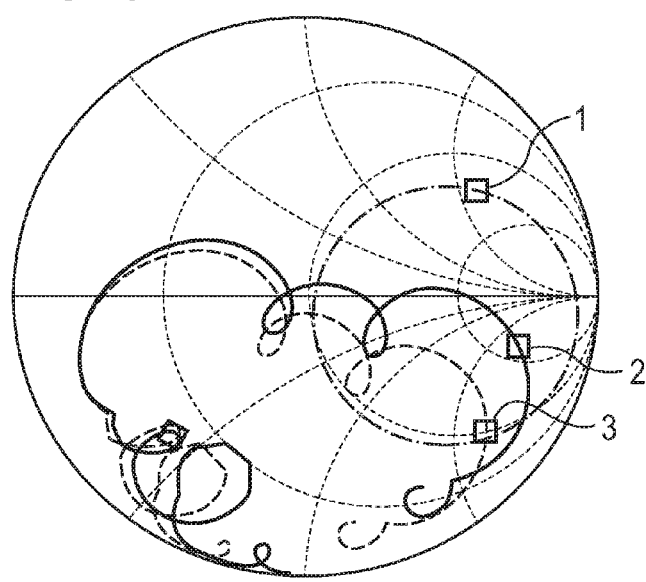
FIG. 19 shows, in a Smith chart, the parameter $S_{22}$ of the individual components of the filter arrangement of FIG. 9 with and without a capacitive element and the parameter $S_{11}$ of the two-port resonator.
Figure 20:
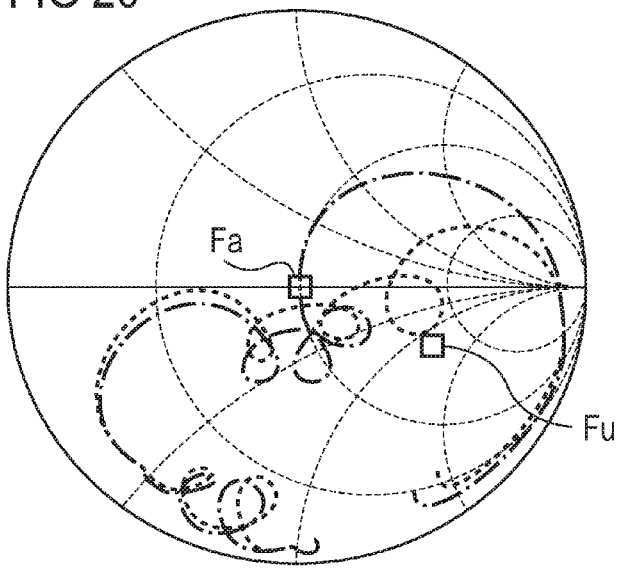
FIG. 20 shows, in a Smith chart, the parameter $S_{22}$ of the filter arrangement of FIG. 9 with and without a capacitive element.

The improved matching is shown in FIGS. 18-20. FIG. 18 shows the simulated parameters $S_{21}$ of the scatter matrix, that is, the transmission behavior of the matched arrangement shown in FIG. 9 with the capacitive element (curve Fa) in comparison with the unmatched arrangement without the capacitive element (curve Fu). A slight improvement is to be seen at the right edge of the passband at ca. 1900 MHz.

A simulated representation of the reflection parameters $S_{11}$, $S_{22}$ of the scatter matrix for the individual elements of the filter arrangement is shown in FIG. 19 as a Smith chart. For good matching, $S_{22}$ on the output of the DMS track (curve 3) has a complex conjugate relationship to the parameter $S_{11}$ on the input of the reactance element/two-port resonator (curve 1), which corresponds to a reflection on the x-axis. The emphasized value at 1900 MHz (see box) shows poor matching for the individual components or their reflection factors.

In contrast, curve 3 shows the parameter $S_{22}$ for a DMS track including capacitive element. One can see that, in curve 3, the point at 1900 MHz has an approximately complex conjugate relationship to the corresponding point of curve 1 of the resonator, that is, there is good matching.

This is also clear by the output reflection factor $S_{22}$ shown in FIG. 20 for the overall filter arrangement with the capacitive element (curve Fa) and without the capacitive element (curve Fu). While the value at 1900 MHz of the curve Fu is error matched, for the curve Fa it lies at the origin and shows optimal matching.

Figure 10:
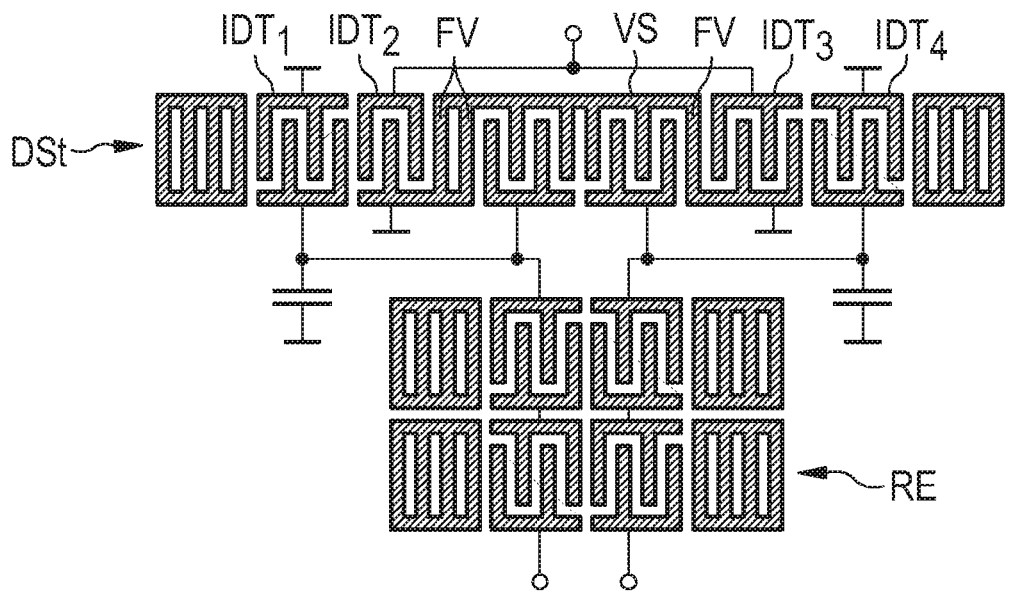
FIG. 10 shows a similar arrangement with a cascaded two-port resonator as a reactance element.
Figure 11:
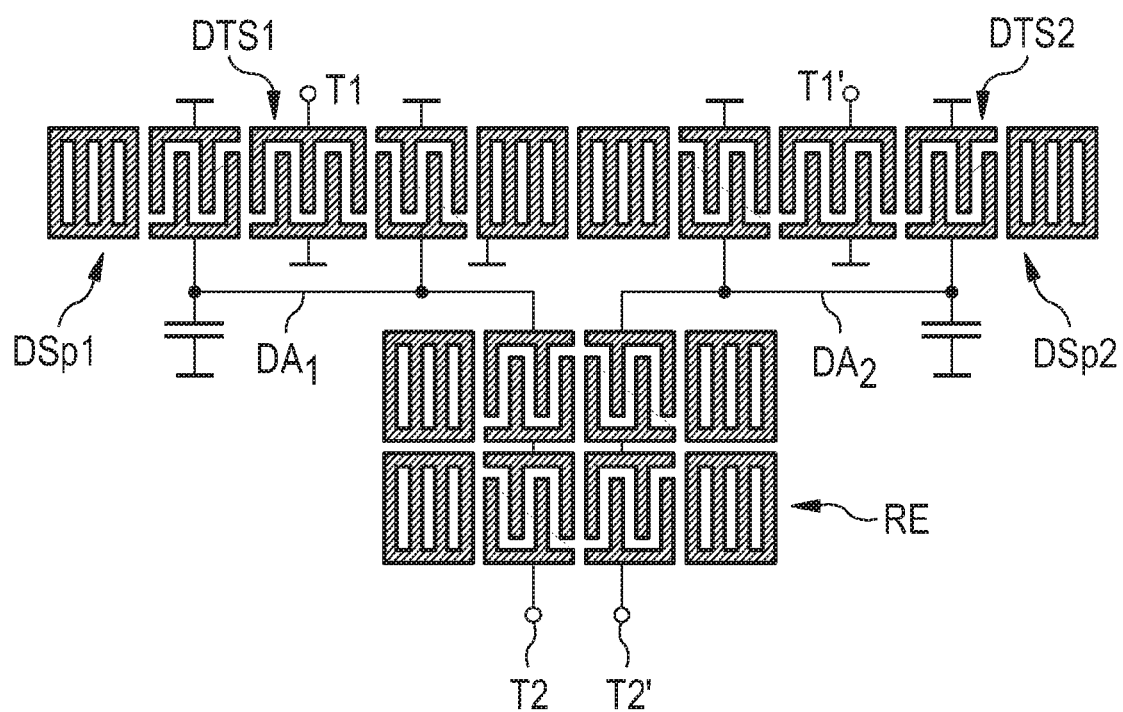
FIG. 11 shows, in another modification, a DMS track divided into two DMS sub-tracks.

FIG. 10 shows another embodiment of the filter arrangement in which, in a departure from FIG. 11, the reactance element RE is also formed as a double-cascaded two-port resonator. A double cascade here means the series connection of two four-pole reactance elements that here each represent one-track SAW two-port resonators. Therefore, if the power compatibility of the resonator is increased, in certain cases, in comparison with the non-cascaded case, the bulk acoustic wave losses or the reflector losses are reduced through the use of a larger number of transducer fingers (>100).

FIG. 11 shows an arrangement in which the DMS track is divided into two DMS sub-tracks, each with three interdigital transducers. A separate signal path runs through each of the two DMS sub-tracks DTS1, DTS2 so that a symmetric signal can also be applied on the input side to the two first terminals T1, T1', wherein this signal can be guided in the two DMS sub-tracks independently of each other. On the output side, the two signal-carrying conductor sections are connected in series with a reactance element that here is formed as a four-pole reactance element and especially as a cascaded two-gate resonator. By selecting suitable transducer orientations, however, the two first terminals T1, T1' can also be connected to an asymmetric connection.

Figure 12:
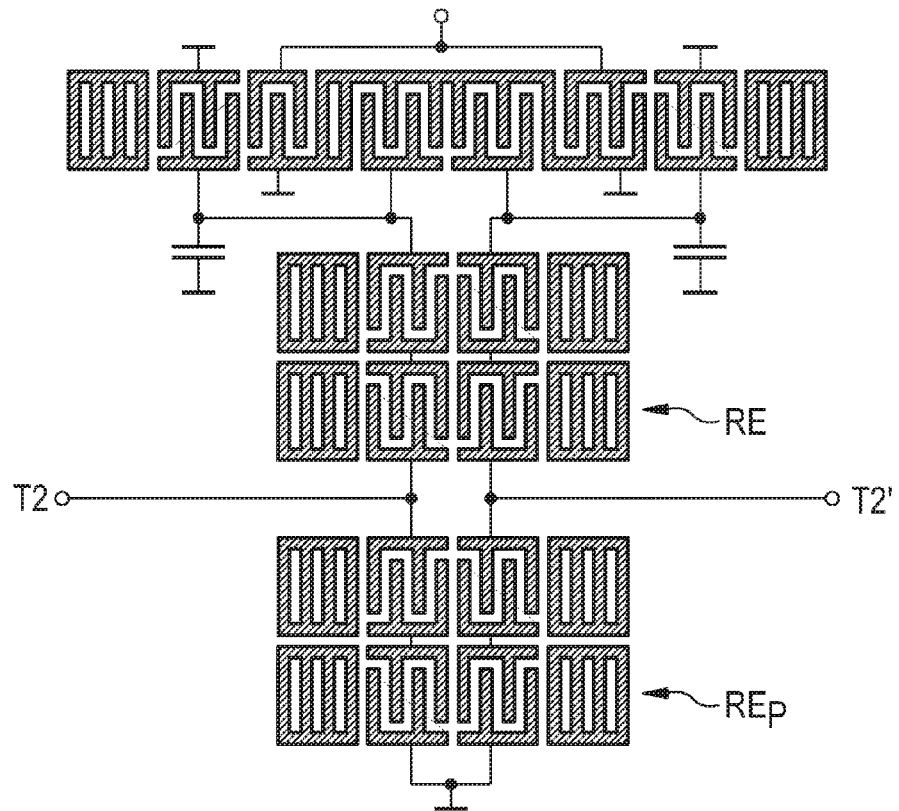
FIG. 12 shows a filter arrangement with a first cascaded two-port resonator within the signal path and another cascaded two-port resonator parallel to the outputs of the first two-port resonator.

FIG. 12 shows another embodiment in which a filter arrangement like that in FIG. 10 is also connected on the output side in parallel with another four-pole reactance element that is connected to ground. The four-pole parallel reactance element $RE_P$ connected to ground can also be formed as a cascaded two-port resonator. On the output side, the two terminals of the parallel reactance element $RE_p$ are connected to ground or, as shown, short-circuited and selectively connected or not to a ground terminal. This arrangement corresponds to an equivalent circuit diagram in which the two output-side terminals T2, T2' of the filter arrangement are bridged by a shunt branch in which four transducers are connected in series.

Figure 13:
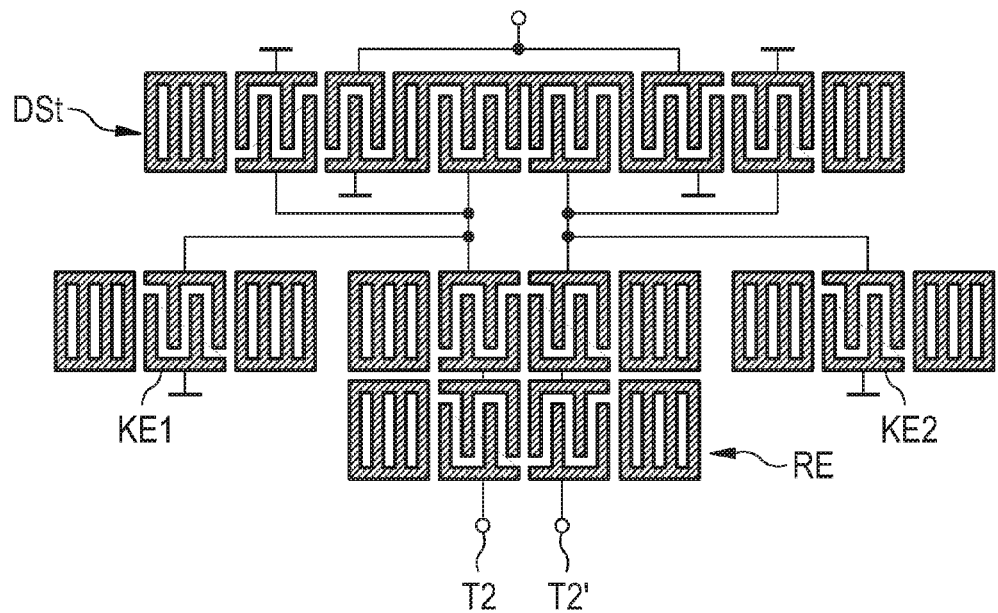
FIG. 13 shows a filter arrangement with two signal paths and a one-port resonator in each of two shunt branches connected in parallel to each other and a two-port resonator on the symmetric output.

FIG. 13 shows another embodiment of a filter arrangement in which a DMS track DSt is connected on the output side via two signal-carrying conductor sections to a four-pole reactance element RE. Between the reactance element RE and DMS track DSt there are two conductor sections that are each connected to ground via a shunt branch with a parallel resonator that here is formed as a SAW one-port resonator. The static capacitance of the one-port resonator here is used as a capacitive element. In addition, such a parallel one-port resonator together with the output-side reactance element RE can form a basic element that improves the matching of the DMS track to the reactance element. According to the selection of the resonance frequency of the parallel resonators, the selection could also be increased in a desired stopband, but it is important that the resonator functions capacitively in the upper passband of the filter.

Figure 14:
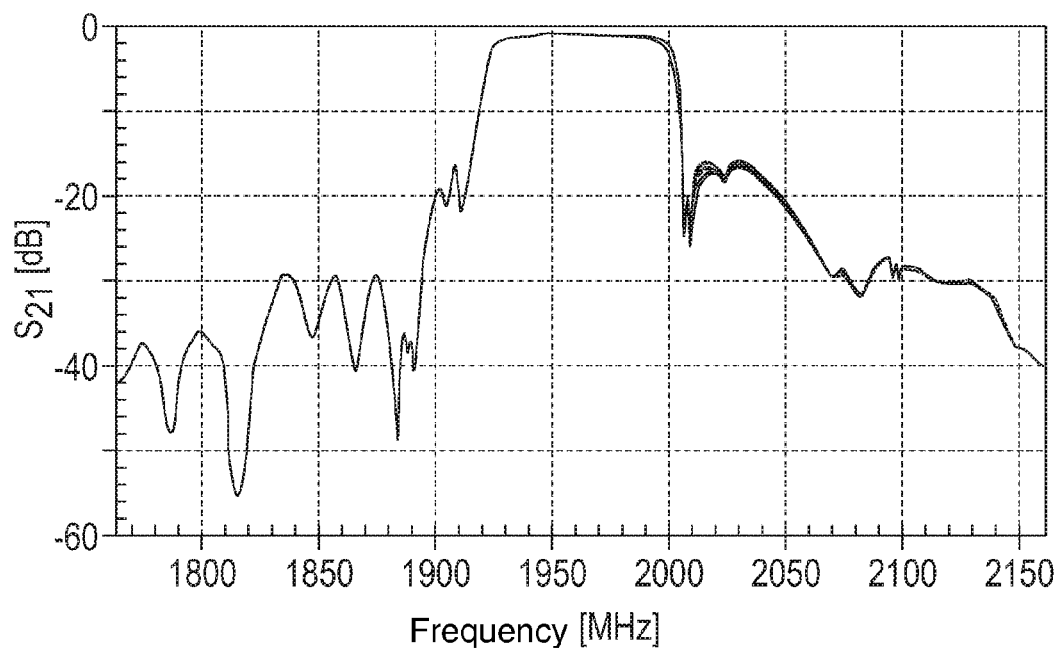
FIG. 14 shows the simulated transmission curves of a filter arrangement according to FIG. 2 with different capacitance values and the respective optimum parallel inductor thereto on the output.

FIG. 14 shows simulated transmission curves in the form of the matrix parameter $S_{21}$ of filter arrangements according to FIG. 2 with parallel tracks on the output in which the capacitive element is calculated or simulated with different capacitance values. For each capacitance value, an optimum value of the parallel inductor on the output was used. The larger the capacitance, the smaller the inductance of the parallel inductor that must be selected. It has been shown that by the capacitive element, the matching is improved especially in the upper region of the passband and in the region of the stopband close to the top. This is shown more clearly with reference to the matrix parameter $S_{11}$ shown in FIG. 15 that represents the reflection on the input port. Here, the reflection is also reduced by the capacitive element and thus the matching in the top region of the passband is improved.

Figure 15:
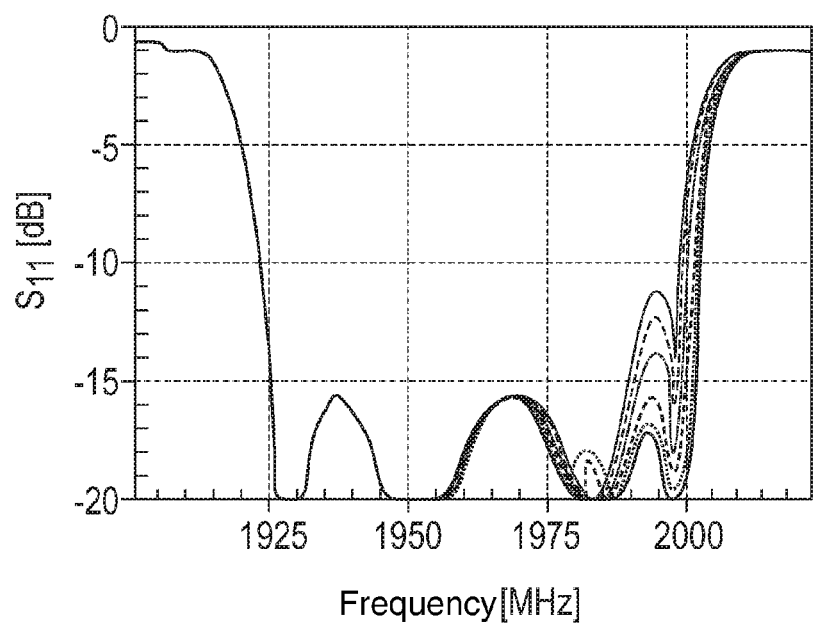
FIG. 15 shows the input reflection factor $S_{11}$ of this same filter.
Figure 16:
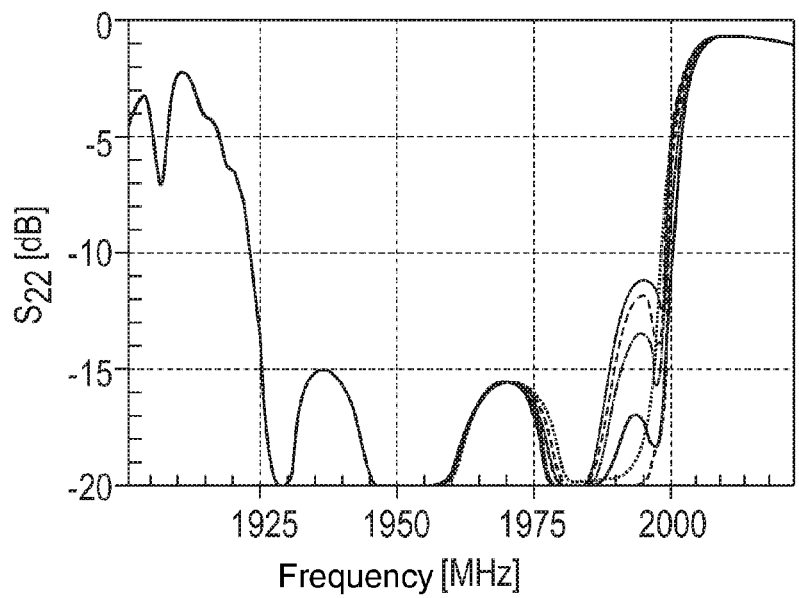
FIG. 16 shows a simulated output reflection factor $S_{22}$ of this same filter.

The S parameters $S_{11}$ and $S_{22}$ shown in FIGS. 15 and 16 represent the reflection at the input or output of the entire filter and also show that the matching in the upper range of the passband is influenced by the capacitive element and can be improved in the desired way. The exact selection of the capacitance value of the capacitive element is determined in an optimization as a trade-off with other properties of the filter arrangement, such as, e.g., the bandwidth.

Figure 17:
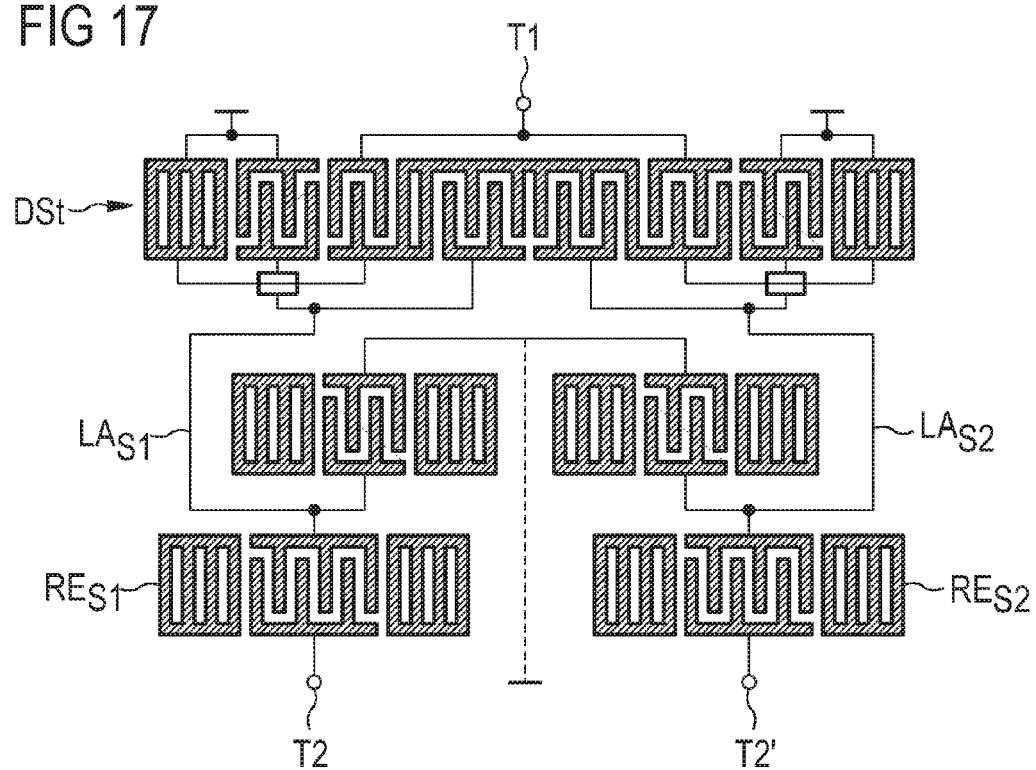
FIG. 17 shows a special embodiment of a filter arrangement with a track conductor crossing as a capacitive element with two additional one-port resonators that are connected to ground branching away from the two signal paths in shunt branches.

In FIG. 17, a filter arrangement is shown that is distinguished by an advantageous conductor guidance of the signal paths and the shunt branches. In this filter arrangement, a DMS track DSt is connected by means of two signal-carrying conductor sections $LA_{s1}$, $LA_{s2}$ to a series reactance elements $RE_{s1}$ and $RE_{s2}$, respectively, that are each connected to the output. In addition, the two signal-carrying conductor sections $LA_{s1}$, $LA_{s2}$ are connected by means of a shunt branch in which two SAW one-port resonators are connected in series that thus represent parallel reactance elements. In the middle, between these two parallel one-port resonators, another shunt branch that is connected to ground branches away optionally as shown in the figure.

Figure 21:
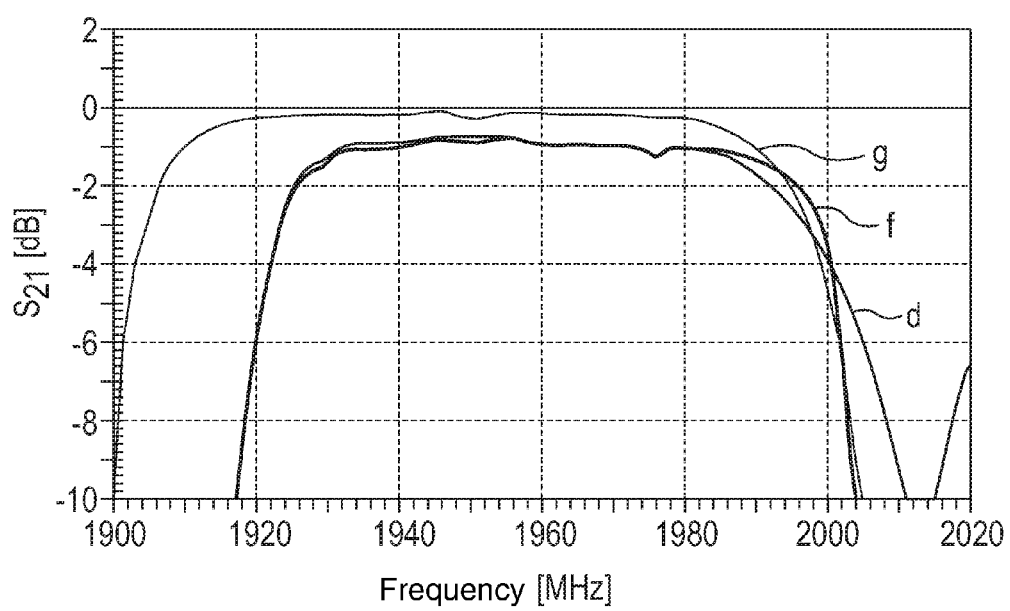
FIGS. 21 to 23 show the scattering parameters $S_{21}$, $S_{11}$, and $S_{22}$ for a DMS track, a basic element, and also for the filter arrangement shown as a whole in FIG. 17.
Figure 22:
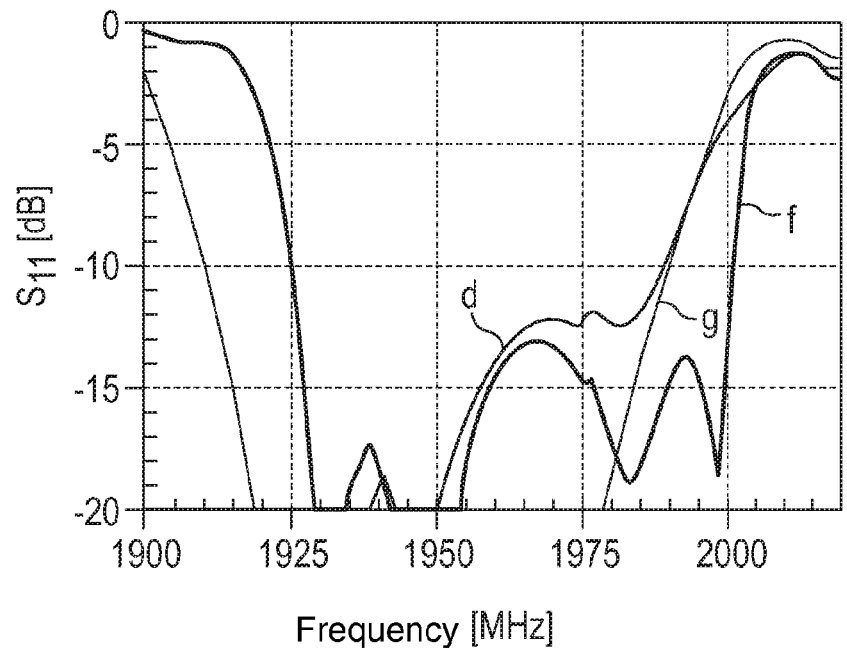
Figure 23:
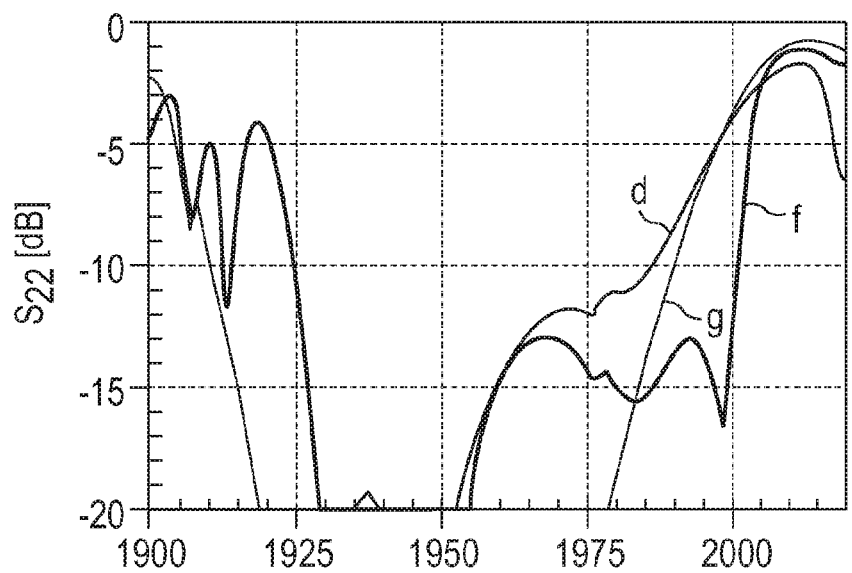

These two parallel one-port resonators act as a capacitive element in a way according to the invention by means of their static capacitance for improving the matching of the DMS track to the reactance elements $RE_{s1}$, $RE_{s2}$ connected in series. In addition, together with the series reactance elements $RE_s$, they each form a basic element that, however, is strongly error-matched primarily in the top passband region, because there it functions capacitively. FIGS. 21-23 show the scattering parameters $S_{21}$, $S_{11}$, and $S_{22}$ for the DMS track (curve d) and the basic element (curve g) of a reactance filter formed from series and parallel reactance elements, as well as for the filter arrangement (curve f) shown in FIG. 17 as a whole. Despite the poor matching of the individual elements, good overall matching with especially low reflection is nevertheless produced without additional external matching elements.

As a special feature, the filter arrangement shown in FIG. 17 has two conductor crossings in which a signal-carrying conductor section $LA_S$ crosses a conductor section $LA_M$ at ground potential. In the crossing region, the two conductor sections are separated from each other by an insulating layer. These conductor crossings represent two additional capacitive elements that represent, in the equivalent circuit diagram, shunt branches to the signal-carrying conductor sections $LA_s$ and are connected to ground by means of the capacitive element of the conductor crossing. Accordingly, each of the two signal-carrying conductor sections $LA_S$ of the filter arrangement has two shunt branches to ground, wherein two of the shunt branches have a conductor crossing as a capacitive element and two shunt branches each have a one-port resonator as a capacitive element.

The shown filter arrangement manages without an external matching element but is nevertheless well matched. It has been found that especially good matching can be achieved particularly if the operating frequencies are sufficiently high and have settled specifically in the range of 2 GHz (greater than or equal to 1.6 GHz).

The invention described with reference to a few embodiment examples is not restricted to the exact implementation of the embodiment examples. Instead, it is possible to arbitrarily combine special implementation of the DMS track, reactance element, and capacitive element from the different embodiment examples with each other. The decisive factor is always that the capacitive element is provided with a sufficient capacitance for which the parasitic capacitances in each filter arrangement are not sufficient.

Advantageously, all of the elements of the filter arrangement, such as DMS track, capacitive element, and reactance element are formed as metallization structures on the surface of the piezoelectric substrate. Alternatively, the capacitive element could be formed by metallization layers on the top and bottom sides of the substrate. The reactance element could also be realized in the form of external LC elements. Advantageously, however, it is also formed as a SAW structure and especially as a SAW resonator with a metallization layer similar to the DMS track on the surface of the substrate.

What is claimed is:

1. A filter arrangement comprising:
    a signal path connected between an input and an output, the signal path arranged at least in some sections on a piezoelectric substrate;
    a DMS track:
    a reactance element, the reactance element and the DMS track being electrically connected in series in the signal path;
    a capacitive element, wherein the capacitive element has a capacitance that corresponds to 0.1-2.0 times the average static capacitance of a transducer in the DMS track; and
    a shunt branch to the signal path connected to a ground potential by means of the capacitive element, the shunt branch being arranged between the DMS track and the reactance element.

2. The filter arrangement according to claim 1, further comprising parallel and/or series inductances matching on the input and/or output.

3. The filter arrangement according to claim 1, wherein the reactance element comprises as a SAW resonator.

4. The filter arrangement according to claim 1, wherein the capacitive element comprises an interdigital structure.

5. The filter arrangement according to claim 4, wherein the interdigital structure has intermeshing comb electrodes whose finger spacing is less than an average finger spacing of a transducer of the DMS track.

6. The filter arrangement according to claim 4, wherein the interdigital structure is rotated relative to transducers of the DMS track.

7. The filter arrangement according to claim 6, wherein the interdigital structure is rotated 90° with respect to the transducers of the DMS track.

8. The filter arrangement according to claim 1, wherein the capacitive element is formed by two metallization areas arranged one above the other on the substrate and electrically insulated from each other by an insulating layer.

9. The filter arrangement according to claim 1, wherein the capacitive element is formed by first and second directly adjacent metallization areas arranged on the substrate, wherein the first metallization area is formed by a ground terminal pad of the filter arrangement and wherein the second metallization area is connected to a signal-carrying connection line between the DMS track and reactance element or represents a connection line widened into a metallization area.

10. The filter arrangement according to claim 1, wherein the capacitive element is formed by a metallization area arranged on a top side and a bottom side of the substrate.

11. The filter arrangement according to claim 1, wherein a connection of the reactance element and DMS track has two sections of signal paths that are connected symmetrically to each other and that can be operated symmetrically,
    a first of the two sections is connected to the shunt branch in which the capacitive element is arranged and a second of the two sections is connected to a further shunt branch in which a further capacitive element is arranged.

12. The filter arrangement according to claim 11, wherein each shunt branch is connected to ground.

13. The filter arrangement according to claim 1, further comprising a second signal path connected between the input and a second output, wherein the second signal path has a one-port resonator as a reactance element.

14. The filter arrangement according to claim 1, wherein a wiring of the reactance element and DMS track has two sections of signal paths that are formed mutually symmetrically and that can be operated symmetrically and that are both connected to a first port of a two-port resonator forming the reactance element.

15. The filter arrangement according to claim 1, wherein the reactance element has cascaded SAW resonators.

16. The filter arrangement according to claim 1, wherein the DMS track has three to nine transducers.

17. The filter arrangement according to claim 1, wherein two transducers arranged centrally in the DMS track are connected to each other by means of a common current rail.

18. The filter arrangement according to claim 1, wherein, in each first and second adjacent transducers of the DMS track, at least one terminal electrode finger pointing toward the second transducer is extended so that it connects a current rail of the first transducer to an opposite current rail of the directly adjacent second transducer.

19. The filter arrangement according to claim 1,
    wherein the DMS track comprises a sole DMS track of the filter arrangement,
    wherein this sole DMS track has five to seven transducers.

20. The filter arrangement according to claim 1, wherein one or more signal paths are connected to ground at the input or output each via a shunt branch, where each of these shunt branches contains a parallel reactance element.

21. The filter arrangement according to claim 1, wherein the capacitive element has a capacitance of 0.1-1.0 pF.

22. The filter arrangement according to claim 1, wherein the capacitive element of the filter arrangement is a SAW resonator that functions in a passband of the filter essentially like a static capacitance without exciting acoustic waves.

23. The filter arrangement according to claim 1, wherein the capacitive element is formed as a SAW resonator.

24. The filter arrangement according to claim 23, wherein a resonance frequency of the capacitive element lies above a passband of the filter arrangement.

25. The filter arrangement according to claim 23, wherein the SAW resonator functions capacitively in an upper third of a passband.

26. The filter arrangement according to claim 23, wherein an average finger period in a transducer of the capacitive element is less than an average finger period in the DMS track.

27. The filter arrangement according to claim 26,
wherein the filter arrangement has a center frequency of at least 1.7 GHz,
wherein the filter arrangement has a relative 3 dB bandwidth of at least 2%,
wherein the SAW resonator connected to ground between the reactance element and the DMS track represents the capacitive element, and
wherein no other external inductors are provided as matching elements.

28. A filter arrangement comprising:
a signal path connected between an input and an output, the signal path arranged at least in some sections on a piezoelectric substrate;
a DMS track:
a reactance element, the reactance element and the DMS track being electrically connected in series in the signal path;
a capacitive element, wherein the capacitive element is formed as a SAW resonator and wherein the capacitive element has a capacitance that corresponds to 0.1-1.0 times an average static capacitance of a transducer in the DMS track; and
a shunt branch to the signal path connected to a ground potential by means of the capacitive element, the shunt branch being arranged between the DMS track and the reactance element.

29. The filter arrangement according to claim 28, wherein the capacitive element has a capacitance that corresponds to 0.1-0.7 times the average static capacitance of a transducer in the DMS track.

30. A filter arrangement comprising:
a signal path connected between an input and an output, the signal path arranged at least in some sections on a piezoelectric substrate;
a DMS track:
a reactance element, the reactance element and the DMS track being electrically connected in series in the signal path;
a capacitive element, wherein the capacitance C specified in farads of the capacitive element is dimensioned so that a value between 0.05 and 1.5 is given for the term $2\pi fRC$, where f represents an operating frequency in hertz and R represents a reference resistance of the signal path in ohms: and
a shunt branch to the signal path connected to a ground potential by means of the capacitive element, the shunt branch being arranged between the DMS track and the reactance element.

\* \* \* \* \*

UNITED STATES PATENT AND TRADEMARK OFFICE
CERTIFICATE OF CORRECTION

| | | |
|---|---|---|
| PATENT NO. | : 7,915,975 B2 | Page 1 of 1 |
| APPLICATION NO. | : 12/473107 | |
| DATED | : March 29, 2011 | |
| INVENTOR(S) | : Bauer et al. | |

It is certified that error appears in the above-identified patent and that said Letters Patent is hereby corrected as shown below:

In Col. 12, line 11, claim 11, before "a first" insert --wherein--.

Signed and Sealed this
Thirty-first Day of May, 2011

David J. Kappos
*Director of the United States Patent and Trademark Office*